United States Patent
Fanara et al.

(10) Patent No.: US 10,326,686 B2
(45) Date of Patent: Jun. 18, 2019

(54) APPARATUS AND METHOD FOR TESTING INSTALLATION OF NETWORK EQUIPMENT ONBOARD LOCOMOTIVE

(71) Applicant: Progress Rail Locomotive Inc., LaGrange, IL (US)

(72) Inventors: Mark A. Fanara, Blue Springs, MO (US); Douglas G. Lihosit, Chicago, IL (US); John M. Handy, Wheaton, IL (US); Wayne A. Rudolph, Lemont, IL (US)

(73) Assignee: Progress Rail Locomotive Inc., LaGrange, IL (US)

( * ) Notice: Subject to any disclaimer, the term of this patent is extended or adjusted under 35 U.S.C. 154(b) by 146 days.

(21) Appl. No.: 15/407,300

(22) Filed: Jan. 17, 2017

(65) Prior Publication Data

US 2018/0205615 A1    Jul. 19, 2018

(51) Int. Cl.
*B61L 15/00* (2006.01)
*G01R 31/00* (2006.01)
(Continued)

(52) U.S. Cl.
CPC ............ *H04L 45/02* (2013.01); *B61L 15/009* (2013.01); *B61L 15/0036* (2013.01); *B61L 15/0072* (2013.01); *B61L 15/0081* (2013.01); *G01R 31/008* (2013.01); *H04L 43/0817* (2013.01); *H04L 43/50* (2013.01)

(58) Field of Classification Search
CPC ......... H04L 41/12; H04L 43/00; H04L 45/00; H04L 67/12; H04L 2012/40293; H04L 45/02; H04L 43/0817; H04L 43/50; B61L 15/0036; B61L 15/0081; G01R 31/008
See application file for complete search history.

(56) References Cited

U.S. PATENT DOCUMENTS 4,718,271 A    1/1988  Garland
5,265,832 A *  11/1993 Wesling .............. B61L 15/0036
                                          246/169 R (Continued)

FOREIGN PATENT DOCUMENTS

CN      203981806    12/2014
KR      101177206    8/2012
RU         160398    3/2016

*Primary Examiner* — Kevin C. Harper
(74) *Attorney, Agent, or Firm* — Bookoff McAndrews (57) ABSTRACT

An apparatus for testing installation of a network equipment onboard a locomotive of a consist is disclosed. The apparatus includes a housing and a test network equipment is disposed within the housing. The test network equipment includes a first port to connect with an output port of the locomotive via a Multiple Unit (MU) cable. The apparatus includes a user interface to connect with a second port of the test network equipment. The test network equipment establishes a communication with the user interface based on a predefined attribute of the user interface. Upon establishing the communication between the test network equipment and the user interface, the user interface is configured to identify the network equipment, establish one or more communication routes with the network equipment, and determine a status of installation of the network equipment onboard the locomotive using the one or more communication routes.

20 Claims, 4 Drawing Sheets

(51) Int. Cl.
    *H04L 12/26*         (2006.01)
    *H04L 12/751*      (2013.01)

(56) References Cited

U.S. PATENT DOCUMENTS

| | | |
|---|---|---|
| 5,446,389 A | 8/1995 | Lenz |
| 6,997,418 B1 | 2/2006 | Sanzone |
| 8,532,850 B2 | 9/2013 | Cooper et al. |
| 8,903,574 B2 | 12/2014 | Cooper et al. |
| 8,938,326 B1 | 1/2015 | Fanara |
| 9,073,560 B2 | 7/2015 | Fanara et al. |
| 2011/0093144 A1* | 4/2011 | Goodermuth ......... B60T 13/665 701/20 |
| 2013/0261842 A1 | 10/2013 | Cooper et al. |
| 2014/0365160 A1 | 12/2014 | Steffen, II et al. |
| 2015/0291191 A1 | 10/2015 | Habermehl |
| 2018/0149687 A1* | 5/2018 | Backus .................. B61C 17/12 |

\* cited by examiner

APPARATUS AND METHOD FOR TESTING INSTALLATION OF NETWORK EQUIPMENT ONBOARD LOCOMOTIVE

TECHNICAL FIELD

The present disclosure relates to a network equipment onboard a locomotive, and more particularly to an apparatus and method for testing installation of the network equipment onboard the locomotive of a consist.

BACKGROUND

A train includes locomotives that are coupled together to produce motive power for a consist. Generally, the locomotives and rail cars of the consist are physically connected by a Multiple Unit (MU) cable to facilitate a communication between the locomotives. The typical MU cable includes a plurality of pins, each pin capable of carrying a discrete signal indicating a different aspect of operation of the train such as a power level setting requested by a user, and commands transmitted from a computer system of each of the locomotives. A network equipment is disposed onboard the locomotives for accessing the signal transmitted by the MU cable and communicating the signal to among the locomotives to control to coordinate an operation of the locomotives.

An installation of the network equipment onboard the locomotives is tested to demonstrate that the installation is properly performed and the installed network equipment is working as expected. Conventional method of testing is accomplished by connecting a test locomotive to a locomotive in which the network equipment is installed. A process of connecting the test locomotive to the locomotive having the network equipment onboard is inconvenient and costly. In addition, it is difficult to troubleshoot installation problems using the current approach.

U.S. Pat. No. 5,446,389 (the '389 patent) discloses a portable test kit for testing electrical and mechanical operation of a locomotive. The test kit includes one multi-pin connector for connecting to an MU connector on a locomotive. The multi-pin connector is wired in the test kit to a plurality of indicator lights and a plurality of multi-position switches. The lights provide a visual indication of signal presence at the MU connector. The switches enable commands to be placed on the train line through the MU connector to determine if the locomotive is responsive to train line signals. A governor connector and associated indicator lights monitor signals from the locomotive governor system. A plurality of galvanometers is mounted in the kit with corresponding connection jacks for connection to selected points in the locomotive system for simultaneous monitoring of circuit performance. At least a pair of rheostats is connected to the MU connector for controlling loading on selected train line conductors. The test kit also includes apparatus for measuring air pressure, temperature, filter condition, fuel system operation, engine operation, braking capability and alternator output. The test kit of '389 patent fails to test connectivity of the network equipment installed onboard the locomotive.

SUMMARY OF THE DISCLOSURE

In one aspect of the present disclosure, an apparatus for testing installation of a network equipment onboard a locomotive of a consist is provided. The apparatus includes a housing and a test network equipment disposed within the housing. The test network equipment includes a first port configured to connect with an output port of the locomotive via a Multiple Unit (MU) cable. The apparatus also includes a user interface configured to connect with a second port of the test network equipment. The test network equipment is configured to establish a communication with the user interface based on a predefined attribute of the user interface. Upon establishing the communication between the test network equipment and the user interface, the user interface is configured to receive a status message from the test network equipment. The status message is indicative of identification of the network equipment onboard the locomotive by the test network equipment based on signals received from the locomotive via the MU cable. The user interface is further configured to establish one or more communication routes with the network equipment onboard the locomotive and the user interface, when the network equipment onboard the locomotive is identified by the test network equipment. The user interface is also configured to send a request to the network equipment onboard the locomotive via the established one or more communication routes and determine a status of installation of the network equipment onboard the locomotive based on a response corresponding to the request received from the network equipment onboard the locomotive.

In another aspect of the present disclosure, a method of testing installation of a network equipment onboard a locomotive of a consist is provided. The method includes receiving, by a test network equipment, signals from the locomotive via a Multiple Unit (MU) cable and establishing a communication between a user interface and the test network equipment based on a predefined attribute of the user interface. The method further includes receiving a status message from the test network equipment by the user interface. The status message is indicative of identification of the network equipment onboard the locomotive by the test network equipment based on the signals received from the locomotive via the MU cable. The method further includes establishing one or more communication routes between the network equipment onboard the locomotive and the user interface, when the network equipment onboard the locomotive is identified by the test network equipment. The method further includes sending a request to the network equipment onboard the locomotive via the established one or more communication routes and determining a status of the installation of the network equipment onboard the locomotive based on a response corresponding to the request received from the network equipment onboard the locomotive.

In yet another aspect of the present disclosure, a testing system for a locomotive of a consist is provided. The testing system includes a network equipment onboard the locomotive and an apparatus connected to the network equipment onboard the locomotive. The apparatus is configured to test installation of the network equipment onboard the locomotive. The apparatus includes a housing and a test network equipment disposed within the housing. The network equipment includes a first port configured to connect with an output port of the locomotive via a Multiple Unit (MU) cable. The apparatus also includes a user interface configured to connect with a second port of the test network equipment. The test network equipment is configured to establish a communication with the user interface based on a predefined attribute of the user interface. Upon establishing the communication between the test network equipment and the user interface, the user interface is configured to receive a status message from the test network equipment.

The status message is indicative of identification of the network equipment onboard the locomotive by the test network equipment based on signals received from the locomotive via the MU cable. The user interface is further configured to establish one or more communication routes with the locomotive and the user interface, when the network equipment onboard the locomotive is identified by the test network equipment. The user interface is also configured to send a request to the network equipment onboard the locomotive via the established one or more communication routes and determine a status of installation of the network equipment onboard the locomotive based on a response corresponding to the request received from the network equipment onboard the locomotive.

Other features and aspects of this disclosure will be apparent from the following description and the accompanying drawings.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

Figure 1:
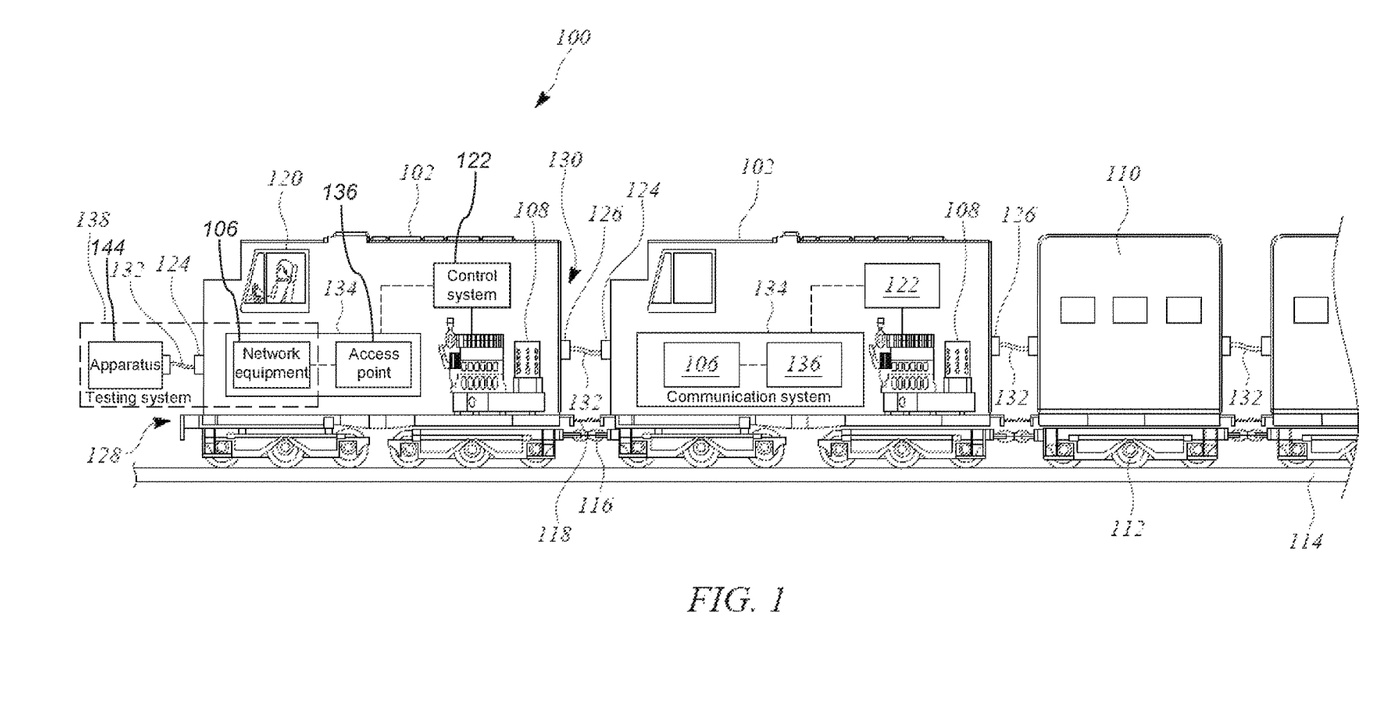
FIG. 1 is a schematic diagram of a consist having multiple locomotives and a testing system for testing a network equipment installed in the locomotives, according to one embodiment of the present disclosure.

FIG. 1 illustrates a schematic diagram of a consist 100 having multiple locomotives 102. Each of the multiple locomotives 102 is installed with a network equipment 106, according to one embodiment of the present disclosure. Each locomotive 102 includes an engine 108 for producing mechanical power. The mechanical power produced by the engine 108 is directed to a generator (not shown) to generate electricity. The electricity is routed to traction motors (not shown) of the locomotives 102, thereby generate torque at wheels 112 of the locomotives 102 to propel two or more rail cars 110 for carrying passengers or goods. In one embodiment, the locomotives 102 may be one of a diesel-electric locomotive, a coal-electric locomotive, a gas-electric locomotive, and a hybrid locomotive. The locomotives 102 may be connected to each other using a mechanical coupling 116 and a fluid coupling 118. The mechanical coupling 116 may transmit tractive and braking forces between the locomotives 102. The fluid couplings 118 may transmit fluids including, but not limited to, fuel, coolant, lubricant, and pressurized air between the locomotives 102. Although the consist 100 includes multiple locomotives 102, for illustration purpose of the present disclosure, one locomotive of the multiple locomotives 102 is explained in detail and also hereinafter interchangeably referred to as "the locomotive 102" or "the locomotives 102".

The locomotive 102 may accommodate an operator cabin 120 having an operator interface (not shown) having control levers, switches, and a display. The locomotive 102 may accommodate a control system 122 for controlling operations of the locomotive 102. The control system 122 may be configured to generate control signals and/or data based on signals collected from one or more of sensors, valves, pumps, heat exchangers, accumulators, regulators, actuators, and Global Positioning System (GPS) disposed in the locomotive 102. The generated control signals and/or data are used to control the operations of the locomotive 102.

The locomotive 102 includes an output port. The output port includes a first output port 124 and a second output port 126 located at a front end 128 and a rear end 130, respectively, thereof. The locomotives 102 are electrically coupled to each other using an intra-consist electrical cable, such as a Multiple Unit (MU) cable 132. Particularly, the MU cable 132 is coupled with the first output port 124 of one locomotive and the second output port 126 of an adjacent locomotive. The MU cable 132 includes multiple pins capable of transmitting at least one of electrical power generated by the generator, the control signals generated by the control system 122, and data, such as power level setting requested by a user of the locomotive 102. It may be understood that the first and the second output ports 124, 126 may be MU cable receptacles having multiple ports configured to receive the multiple pins of the MU cable 132. In one embodiment, a dedicated data link (not shown), such as ethernet cable is implemented for transmitting data packets between the control system 122 of each of the locomotives 102. In another embodiment, data can be transmitted between the locomotives 102 via a combination of the MU cable 132 and the dedicated data link.

Each of the locomotives 102 includes a communication system 134 that is connected to the control system 122 for facilitating a coordinated control of the consist 100. The communication system 134 of each of the locomotives 102 may form a local area network to control a communication between the control systems 122 of the locomotives 102. Specifically, the communication system 134 controls transmission of the control signals and data associated with the locomotive 102 to facilitate the coordinated control of the consist 100. The communication system 134 includes, but is not limited to, an access point 136, and the network equipment 106. The network equipment 106 may also be referred to as Train Line Network (TLN) equipment. It may be understood that the communication system 134 disclosed herein may be exemplary and may include multiple components other than the access point 136 and the network equipment 106 for performing functions of the communication system 134, without departing from the scope of present disclosure.

The network equipment 106 may include at least one of an inter-consist router (IC router), an ethernet bridge, and a modem. The IC router, hereinafter interchangeably referred to as "the router", may facilitate communication between the locomotives 102 that are connected to each other via the MU cable 132 based on an IP address of the control system 122.

The ethernet bridge may be configured to convert data to an electrical signal capable of being transmitted through the MU cable 132. The ethernet bridge may be connected to the modem. The modem may be configured to modulate a carrier signal sent over the MU cable 132 with the signal received from ethernet bridge to transmit data between the access points 136. The modem may also be configured to demodulate signals received from the locomotive 102 and send the demodulated signals to the ethernet bridge for conversion to data that may be transmitted to the control system 122 of the locomotive 102. For example, the router may perform the operations of the ethernet bridge described above, or perform the operations of the modem.

In one embodiment, each of the access point 136 and the network equipment 106 may include a processor (not shown) and a memory (not shown). The processor may include one or more processing devices, such as microprocessors and/or embedded controllers. The memory may include volatile or non-volatile, magnetic, semiconductor, tape, optical, removable, non-removable, or other type of computer-readable medium or computer-readable storage device. The memory may be configured to store programs and/or other information that can be used to implement one or more of the processes discussed below. The memory may include one or more storage devices configured to store information.

A testing system 138 is implemented in the locomotives 102 for testing installation of the network equipment 106 disposed in the locomotive 102. The testing of installation of the network equipment 106 is performed upon completing each of, but not limited to, the mechanical coupling 116, the fluid coupling 118, and MU cable connections between the multiple locomotives 102 of the consist 100. For testing the installation of the network equipment 106, the control system 122 of the locomotive 102 having the network equipment 106 onboard may be powered ON. For illustration purpose, the present disclosure describes the testing system 138 for the routers. However, it should be noted that the installation of the testing system 138 may be implemented to test the installation of the network equipment 106 such as the ethernet bridge, and the modem, without departing from the scope of the present disclosure.

The testing system 138 includes the network equipment 106 onboard the locomotive 102, for which the installation needs to be tested. In one embodiment, the testing system 138 also includes an apparatus 144 communicably connected to the locomotive 102 via the MU cable 132 as shown in FIG. 1. The apparatus 144 is configured to test the installation of the network equipment 106 onboard the locomotive 102. In other embodiments, the testing system 138 may be in communication with the multiple locomotives 102 of the consist 100, without departing from the scope of the present disclosure.

Figure 2:
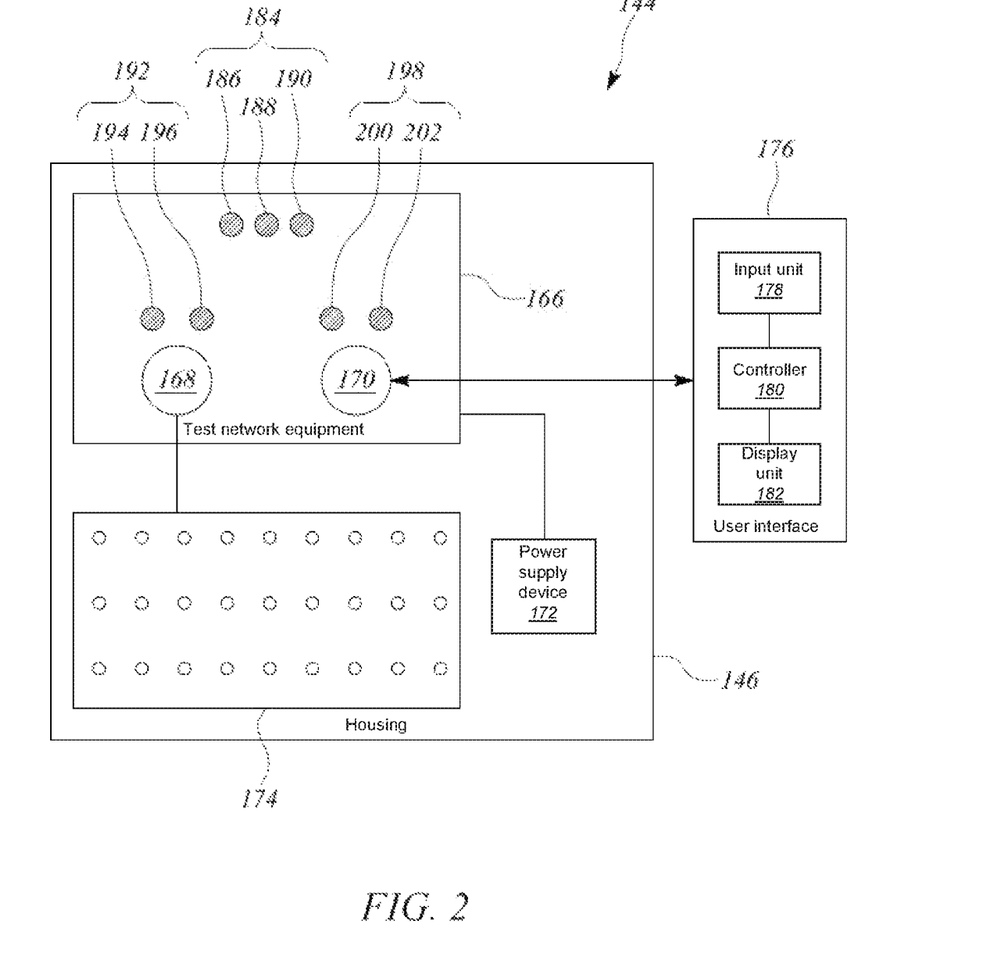
FIG. 2 is a block diagram of the testing system having an apparatus for testing installation of the network equipment onboard the locomotive of the consist, according to one embodiment of the present disclosure.
Figure 3:
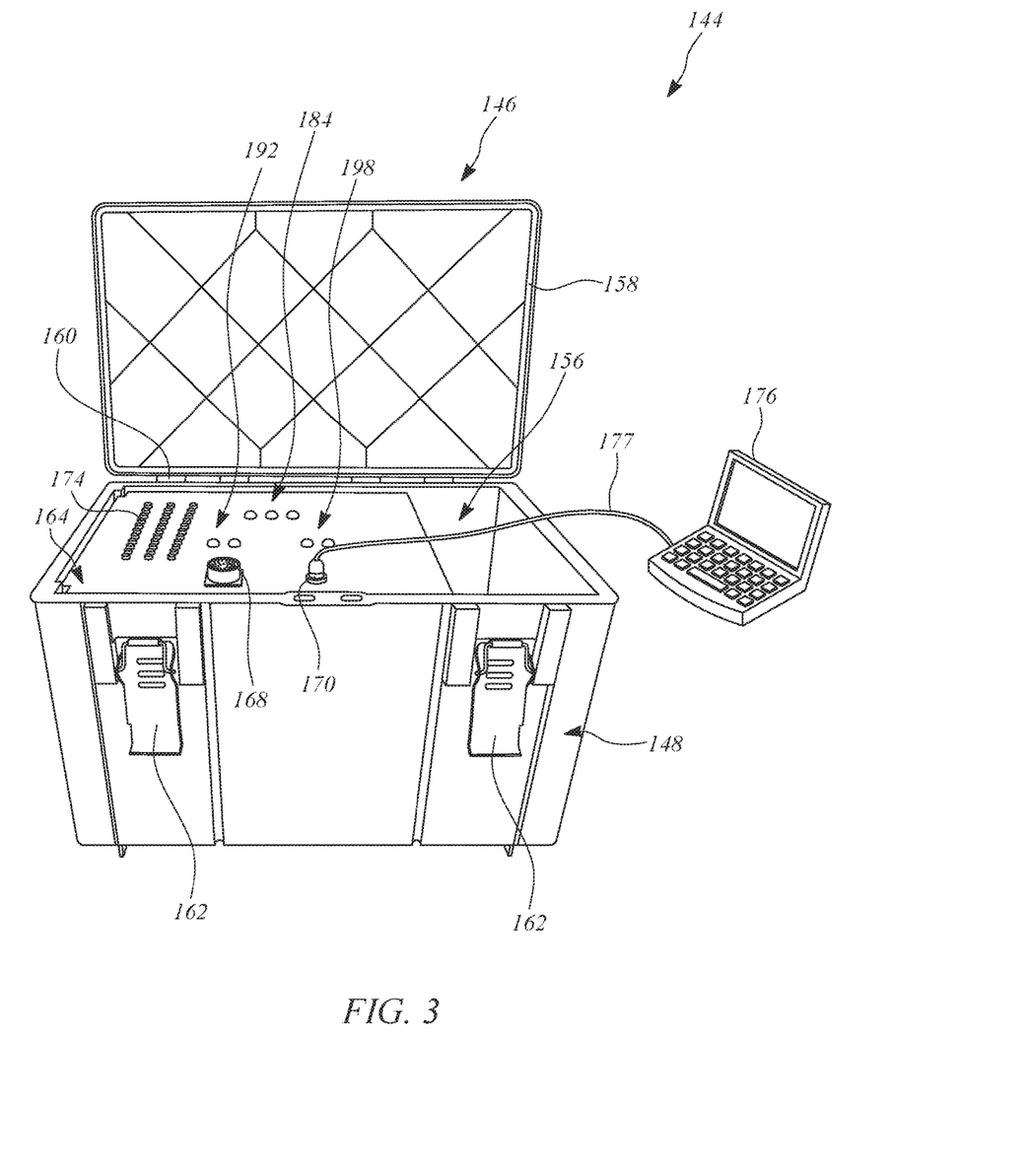
FIG. 3 is a perspective view of the apparatus for testing installation of the network equipment, according to one embodiment of the present disclosure.

FIG. 2 illustrates a block diagram of the testing system 138 for testing installation of the network equipment 106 onboard the locomotive 102, according to one embodiment of the present disclosure. The testing system 138 includes the network equipment 106 onboard the locomotive 102 that needs to be tested and the apparatus 144 for testing installation of the network equipment 106 onboard the locomotive 102. FIG. 3 illustrates a perspective view of the apparatus 144 for testing installation of the network equipment 106, according to one embodiment of the present disclosure.

Referring to FIG. 2 and FIG. 3, the apparatus 144 includes a housing 146 for accommodating multiple components of the apparatus 144. In particular, referring to FIG. 3, the housing 146 includes a base portion 148 and a cover portion 158. The base portion 148 includes a storage area 156 to accommodate multiple cables, such as the MU cable 132 that couples the locomotive 102 with the apparatus 144 while testing the installation of the network equipment 106 and an ethernet cable. The housing 146 further includes a cover portion 158 is located on the top of the base portion 148. The cover portion 158 is configured enclose the multiple components accommodated within the base portion 148. A pair of latches 162 is attached to the housing 146 for locking the base portion 148 and the cover portion 158. The housing 146 includes a panel 164 disposed within the base portion 148.

The apparatus 144 also includes a test network equipment 166 disposed within the base portion 148 beneath the panel 164. The test network equipment 166 may be one of the router, the ethernet bridge and the modem. It may be understood that the test network equipment 166 may be selected based on the network equipment 106 disposed in the locomotive 102, for which the testing of installation is performed. For example, if the testing system 138 is implemented to test the installation of the router, then the test network equipment 166 disposed within the housing 146 is a test router.

The test network equipment 166 includes a first port 168 and a second port 170. In one embodiment, the first port 168 may be located on the panel 164. The first port 168 is an MU cable receptacle. In the illustrated embodiment, the first port 168 is configured to connect with the first output port 124 of the locomotive 102 via the MU cable 132. The test network equipment 166 receives signals from the locomotive 102 via the MU cable 132 connected between the first output port 124 of the locomotive 102 and the first port 168 of the test network equipment 166. In one example, the MU cable 132 may have 27 pins and the first port 168 may have 27 ports for receiving the 27 pins of the MU cable 132. Although, the first port 168 is connected to the first output port 124 of the locomotive in the illustrated embodiment, it may be understood that the first port 168 may be connected to the second output port 126 of the locomotive 102. In one embodiment, the test network equipment 166 is configured to establish a communication with the network equipment 106 via the MU cable 132 based on power line communication. The power line communication allows data transfer between the test network equipment 166 and the network equipment 106 over the MU cable 132. In one example, the communication is established based on IEEE 1901 HomePlug Powerline Alliance Version 2 (HPAV2) standard.

The apparatus 144 may further include at least one Radio Frequency (RF) attenuator (not shown). The RF attenuator may be configured to simulate a worse case transmission medium between the apparatus 144 and the network equipment 106 installed on the locomotive 102. The RF attenuator may be one of a fixed RF attenuator, a switched RF attenuator, and a variable RF attenuator. An attenuation level of the RF attenuator may be changed based on at least one of a specification of the apparatus 144 and a specification of the network equipment 106. In one example, the RF attenuator may be bypassed and the attenuation level may be negligible. In another example, the attenuation level of the RF attenuator may be adjusted. In yet another example, the RF attenuator may be always active and the attenuation level may be fixed.

The apparatus 144 includes a power supply device 172 configured to supply power to the test network equipment 166. In one embodiment, at least two pins of the MU cable 132 carries power generated at the locomotive 102. The at least two pins carrying the power is electrically connected to the power supply device 172. The power supply device 172 derives power required for the test network equipment 166 from the power received from the at least two pins of the MU cable 132. In another embodiment, the power supply device 172 may be connected to an external power supply for deriving power required for the test network equipment 166.

The apparatus 144 also includes a connectivity test panel 174 disposed over the panel 164 of the housing 146. The connectivity test panel 174 is electrically connected to the first port 168 of the test network equipment 166. The connectivity test panel 174 includes a plurality of test points corresponding to the number of pins of the MU cable 132. The connectivity test panel 174 is configured to detect an electrical connectivity of the first output port 124 of the locomotive 102 with the first port 168 of the test network equipment 166. The electrical connectivity mat be tested using a testing tool. The testing tool may be positioned in each test point of the plurality of test points to detect voltage and current at each test point of the plurality of test points, without limiting the scope of the present disclosure. In an example, the connectivity test panel 174 associated with the MU cable 132 having 27 pins includes 27 test points.

The second port 170 of the apparatus 144 is located in the panel 164 of the housing 146. The second port 170 is an ethernet interface for connecting the ethernet cable 177. The second port 170 is configurable based on a specification of network and physical cable connections associated with the network equipment 106.

The apparatus 144 also includes a user interface 176 configured to connect with the second port 170 of the test network equipment 166 via the ethernet cable 177. The user interface 176 includes an input unit 178. The input unit 178, according to an exemplary embodiment, may be at least one of a touch screen, a mouse, a keyboard, a pointing device, a motion recognizer, and a voice recognizer. The input unit 178 is configured to receive a user input to test the installation of the network equipment 106 onboard the locomotive.

The user interface 176 also includes a controller 180. The controller 180 may be a logic unit using any one or more of a microprocessor, and a microcontroller. The controller 180 may be based on integrated circuitry, discrete components, or a combination of the two. In one embodiment, the controller 180 of the user interface 176 operates by executing computer-executable instructions read from a non-transitory computer-readable medium, such as a read only memory, a random access memory, a flash memory, a magnetic disc drive, and an optical disc drive. In addition, data processed by the controller 180 may be read from the memory in addition to being obtained from one or more of the various inputs. The memory may reside in the same integrated circuit device as the processor of the user interface 176 or alternatively located separately from the controller 180. The executing computer-executable instructions include a set of instructions for testing the installation of the network equipment 106.

The user interface 176 further includes a display unit 182. The display unit 182 may be configured to display multiple graphical user interfaces (GUI) showing information associated with the testing of installation of the network equipment 106 onboard the locomotive 102. In one embodiment, the display unit 182 may be a display device including, but not limited to, an LCD, a CRT, and a plasma display.

In one embodiment, the user interface 176 may be implemented via a computer device, such as a PC, a laptop computer, or integrated machine computer, which may be configured to serve the functions of the computer. The user interface 176 includes ports (not shown) to connect with the test network equipment 166. The ports may include, but is not limited to, an ethernet port, a USB connector, and a wired ethernet adapter. It will be appreciated that peripheral circuitry, such as buffers, latches, and switches may be implemented within the user interface 176 or separately as desired.

The user interface 176 is assigned with a predefined attribute. The predefined attribute may be one of an IP address and IP proxy address. Each components of the testing system 138, such as the network equipment 106 and the test network equipment 166, is assigned with the predefined attribute. The predefined attribute assigned to the user interface 176 may be different from the predefined attribute of the network equipment 106, and the test network equipment 166 of the communication system 134. For example, a set of predefined attributes may be reserved for the test network equipment 166 and the network equipment 106. The user interface 176 may not be assigned with any of such reserved predefined attributes. In one embodiment, the user interface 176, the test network equipment 166 and the network equipment 106 of each of the locomotives 102 may be connected to form a local area network. Further, the user interface 176, the test network equipment 166 and the network equipment 106 of each of the locomotives 102 may communicate by following IP traffic in the local area network.

In the preferred embodiment of the present disclosure, the user interface 176 may be configured to send a request to the test network equipment 166 and the network equipment 106 in the local area network. The user interface 176 may be configured receive a reply for the request being sent. The user interface 176 sends the request and receives the reply via various internet protocols. In one embodiment, the user interface 176 implements an Internet Control Message Protocol (ICMP) to send the request and receive the reply. The reply may be an ICMP echo reply.

The user interface 176 may be configured to send join/leave messages over the ICMP to establish multicast group memberships with one of the test network equipment 166 and the network equipment 106. The user interface 176 may further be configured to send and/or receive Service Location Protocol (SLP) unicast and multicast messages to allow the user interface 176 to access multiple network related services offered by the test network equipment 166 and the network equipment 106 prior configurations. The user interface 176 may also be configured to receive User Datagram Protocol (UDP) multicast traffic from the test network equipment 166 and the network equipment 106. It should be understood that the user interface 176 may communicate over multiple network protocols known in the art other than the aforementioned protocols, without departing from the scope of the present disclosure.

The test network equipment 166 is configured to establish a communication with the user interface 176 based on the predefined attribute of the user interface 176. The established communication between the test network equipment 166 and the user interface 176 may be referred to as "ethernet link", as the user interface 176 and the test network equipment 166 are physically connected using the ethernet cable 177. The test network equipment 166 detects the predefined attribute of the user interface 176. On detection of the predefined attribute of the user interface 176, the test network equipment 166 may further determine whether the predefined attribute of the user interface 176 is different from the predefined attributes of the test network equipment 166 and the network equipment 106. The test network equipment 166 also determines whether the user interface 176 is configured to communicate over at least one of the ICMP, SLP, and UDP. If the test network equipment 166 determines that the user interface 176 satisfies the aforementioned criteria, then the test network equipment 166 establishes the communication with the user interface 176 using the predefined attribute. If the user interface 176 is undetected, then the test network equipment 166 fails to establish the communication with the user interface 176. A GUI indicating a status of communication between the test network equipment 166 and the user interface 176 may be displayed on the display unit 182 of the user interface 176. In addition, the established communication of the test network equipment 166 with the user interface 176 may be confirmed using a command line argument specifying a unicast IP address of the test network equipment 166.

Owing to the established communication between the test network equipment 166 and the user interface 176, the user interface 176 is configured to receive a status message from the test network equipment 166. The test network equipment 166 generates the status message indicative of identification of the network equipment 106 onboard the locomotive 102 by the test network equipment 166. The test network equipment 166 may identify the network equipment 106 onboard the locomotive 102 based on signals received from the locomotive 102 via the MU cable 132. The user interface 176 may receive the status message periodically from the test network equipment 166. The status message may include an identification tag of the locomotive 102 having the network equipment 106. In one example, the identification tag of the locomotive 102 may be defined by the control system 122 thereof. The identification tag of the locomotive 102 is also referred to as "the locomotive ID". In one embodiment, upon identifying the network equipment 106 onboard the locomotive 102, the user interface 176 displays a GUI on the display unit 182 to indicate the locomotive ID of the locomotive having the network equipment 106.

In another embodiment, the test network equipment 166 may identify the network equipment 106 onboard the multiple locomotives 102 of the consist 100. It may be understood that the test network equipment 166 may communicate to the network equipment 106 onboard each of the multiple locomotives 102 of the consist 100 owing to the communication between the test network equipment 166 and the network equipment 106 onboard the locomotive 102 via the MU cable 132. In such a scenario, the status message may include identification tags of each of the multiple locomotives 102 of the consist 100 having the network equipment 106 onboard. Further, an interactive icon may be provided on the GUI displayed on the display unit 182 to receive the user input. The interactive icon allows the operator to proceed with testing of the network equipment 106 onboard multiple locomotives 102 of the consist 100. The user interface 176 may cause the GUI to display identification tags of each locomotive 102 having the network equipment 106.

If the network equipment 106 onboard the locomotive 102 remains unidentified by the test network equipment 166, then the status messages received from the test network equipment 166 may indicate that no network equipment 106 is identified. Further, the user interface 176 causes the display unit 182 to display a GUI indicating that the network equipment 106 onboard the locomotive 102 is unidentified. It may be noted that the network equipment 106 installed in the locomotive 102 may remain unidentified until the network equipment 106 reads the identification tag from the control system 122 of the corresponding locomotive 102 after the installation. In addition, the network equipment 106 installed in the locomotive 102 may also remain unidentified by the test network equipment 166 in case of fault conditions including, but not limited to, incomplete booting of the network equipment 106, and improper connection of the network equipment 106 with the MU cable 132.

When the network equipment 106 onboard the locomotive 102 is identified by the test network equipment 166, the user interface 176 is configured to establish one or more communication routes with the network equipment 106 onboard the locomotive 102 and the user interface 176. In one example, the one or more communication routes are established using the communication protocols enabled in the user interface 176. In another example, the user interface 176 establishes the one or more communication routes using the SLP. In order to establish the one or more communication routes, the user interface 176 may send a request to the network equipment 106 onboard the locomotive 102. The network equipment 106 sends a reply to the request on establishing the one or more communication routes. If the network equipment 106 fails in establishing the one or more communication routes, then the network equipment 106 sends an error code to the user interface 176. In one embodiment, the user interface 176 may be configured to provide a GUI to display a status of the one or more communication routes established between the network equipment 106 onboard the locomotive 102 and the user interface 176. The status may include at least one of the locomotive ID, the predefined attribute of the user interface 176 for which the user interface 176 is trying to establish the one or more communication routes, and the error code sent by the network equipment 106. It should be understood that the user interface 176 is configured to establish one or more communication routes for the network equipment 106 onboard each of the locomotives 102. The user interface 176 may be configured to display the status of the one or more communication routes established between the network equipment 106 onboard each of the locomotives 102 and the user interface 176.

The user interface 176 is further configured to ping the network equipment 106 onboard the locomotive 102 to determine a status of installation of the network equipment 106. In an example, the status may include one of test passed and test failed. The status of installation is test passed when the user interface 176 is able to ping the network equipment 106 onboard the locomotive 102. In order to ping the network equipment 106 onboard the locomotive 102, the user interface 176 may send a request to the network equipment 106 onboard the locomotive 102 via the established one or more communication routes. In one example, the user interface 176 sends a request to the network equipment 106 onboard the locomotive 102 as ICMP request packets to the network equipment 106 via the established one or more communication routes. The user interface 176 receives an ICMP echo response corresponding to the request sent. The time required for sending the request and receiving the reply may be named as round-trip time. The response received from the network equipment 106 may indicate information including, but not limited to, receipt of request, errors and packet loss. The response received from the network equipment 106 may also indicate a statistical summary of the results including, but not limited to, minimum round-trip time, maximum round-trip time, a mean round-trip time, and standard deviation of the mean. The user interface 176 determines the status of installation of the network equipment 106 based on the reply received in response to the request. The user interface 176 may be configured to provide a GUI displaying the status of the installation of the network equipment 106 onboard the locomotive 102.

The apparatus 144 further includes a set of light emitting diodes (LED) 184 disposed in the panel 164 to indicate multiple operating conditions of the apparatus 144. In one embodiment, the set of LEDs 184 includes three LEDs, such as a power LED 186, a status LED 188, and a failure LED 190. The power LED 186 is ON to indicate when the apparatus 144 is powered by the power supply device 172. The status LED 188 indicates an operating condition of the test network equipment 166. The failure LED 190 indicates at least one of a starting up condition of the test network equipment 166 and replacement requirement of the test network equipment 166. When the power is applied to the test network equipment 166, the failure LED 190 turns ON for a time interval such as in range of 1 second to 10 second. When starting up of the test network equipment 166 is complete, the failure LED 190 turns OFF and the status LED 188 remains ON.

When the power LED 186 is OFF even after providing power to the test network equipment 166 indicates failure conditions including, but not limited to, failure of the power supply device 172, a loose connection of the power supply device 172, power provided to the test network equipment 166 is insufficient, a failure of the test network equipment 166 to draw power from the power supply device 172, and a hardware failure of the test network equipment 166. The failure LED 190 remains ON after the providing the power to the test network equipment 166, to indicate failure conditions such as improper configuration and the hardware failure of the test network equipment 166.

The apparatus 144 further includes a first indicating unit 192 disposed on the panel 164. The first indicating unit 192 is configured to indicate at least one of a status of connection of the MU cable 132 with the locomotive 102 and the test network equipment 166, proximity of the network equipment 106 onboard the locomotive 102 and the test network equipment 166, and damage of the MU cable 132. In one embodiment, the first indicating unit 192 may include a link LED 194 and an active LED 196. The link LED 194 may indicate the status of communication established between the test network equipment 166 and the network equipment 106 onboard the locomotive 102 via the MU cable 132. Specifically, when the power is supplied to the test network equipment 166, the link LED 194 starts blinking and further remains ON once the communication between the test network equipment 166 and the network equipment 106 onboard the locomotive 102 is established. The active LED 196 blinks at every data transfer between the network equipment 106 onboard the locomotive 102 and the test network equipment 166 via the MU cable 132.

The test network equipment 166 further includes a second indicating unit 198 disposed in the panel 164. The second indicating unit 198 is configured to indicate failure conditions associated with the ethernet cable 177 and the network equipment 106 onboard the locomotive 102. The failure conditions may include, but not limited to, a failure in connection of the ethernet cable 177 with the user interface 176 and the test network equipment 166, a hardware failure of an ethernet interface in the network equipment 106, and a misconfiguration of the network equipment 106. The second indicating unit 198 includes a link LED 200 and an active LED 202. During the starting up of the apparatus 144, the link LED 200 and the active LED 202 blink simultaneously. In normal conditions, after the starting up, the active LED 202 may turn OFF and the link LED 200 may turn ON.

However, the link LED 200 remains OFF when the test network equipment 166 is failed to identify the user interface 176 using the predefined attribute the user interface 176 and failed to establish the communication with the user equipment. The link LED 200 glows when the ethernet link is established between the user interface 176 and the test network equipment 166.

INDUSTRIAL APPLICABILITY

Figure 4:
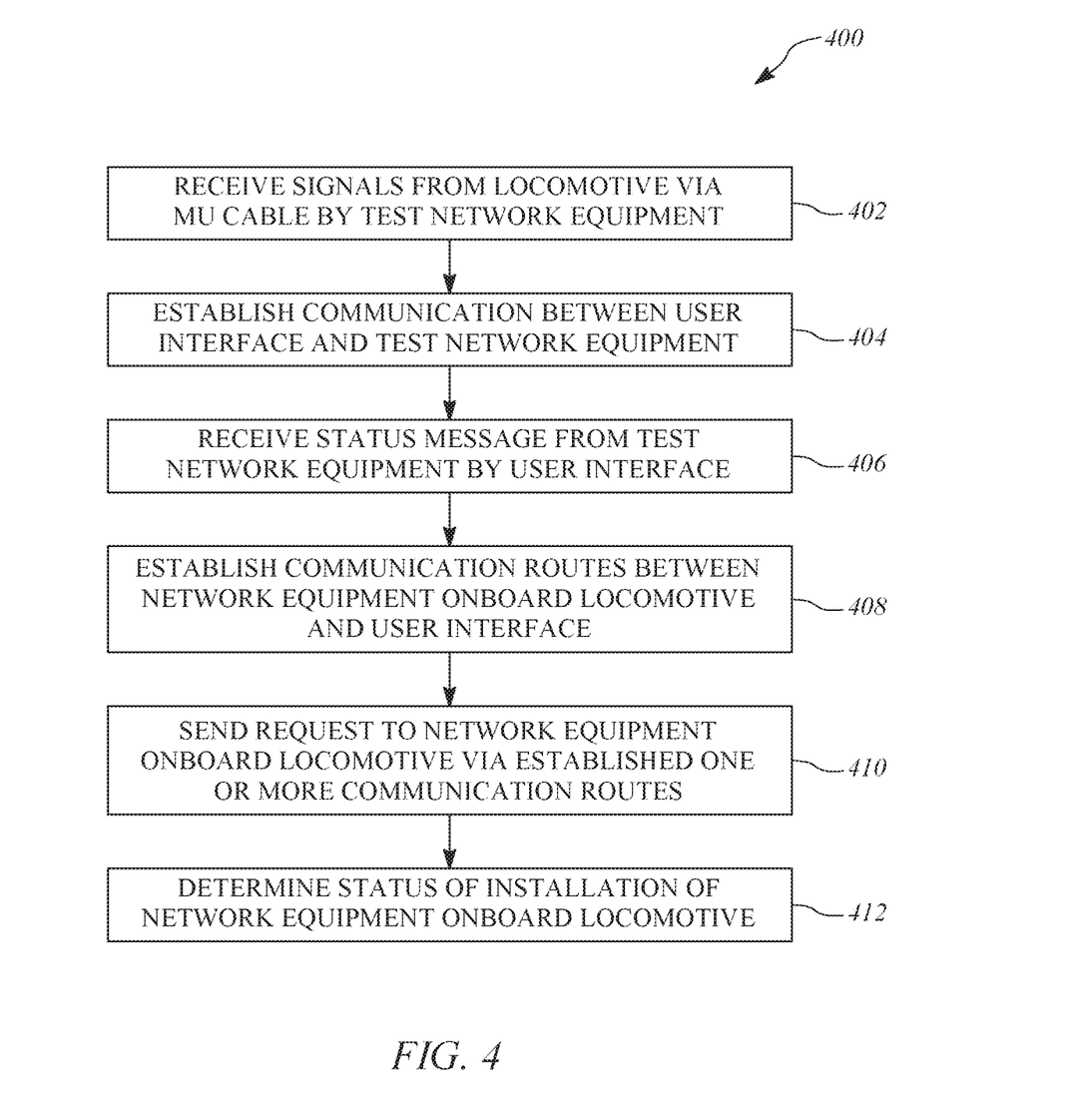
FIG. 4 is a flowchart of a method of testing installation of the network equipment onboard the locomotive of the consist, according to one embodiment of the present disclosure.

The present disclosure relates to the apparatus 144 and a method 400 for testing installation of the network equipment 106 onboard the locomotive 102 of the consist 100. The apparatus 144 of the present disclosure can be implemented for identifying the failure in the installation of the user interface 176. In one embodiment, the apparatus 144 may include the test network equipment 166 and the user interface 176 for testing the installation of the network equipment 106 onboard the locomotive 102. The apparatus 144 may be portable and retrofitted to one of the first output port 124 and the second output port 126 of the locomotive 102.

The apparatus 144 includes multiple components for testing various aspects associated with the installation of the network equipment 106. For example, the user interface 176 is embodied as the computer having the display unit 182, and detects any failure associated with the communication and data transfer of the network equipment 106. In addition, the connectivity test panel 174 may be used for detecting amplitude and frequency of signals transmitted via the MU cable 132. The detected amplitude and frequency of signals may be compared with standard amplitude and frequency of signals required for signals. Any fault condition associated with the multiple components that generates the signals may be identified based on such comparison. Further, the first and second indicating units 192, 198 may also indicate the failure related to the connectivity of the MU cable 132 and the ethernet cable 177. The RF attenuator facilitates validation of the installation of the network equipment 106 and associated cabling. The RF attenuator also facilitates validation of the functioning of the network equipment 106.

Although the present disclosure is explained with regard to the network equipment 106 of the locomotive 102 of the consist 100, the apparatus 144 and the method 400 may be equally applicable for testing multiple components of the communication systems 134 of any machines, without departing from the scope of the present disclosure. Therefore, the apparatus 144 and the method 400 of the present disclosure have wide applications across various industries.

FIG. 4 illustrates a flowchart of the method 400 of testing installation of the network equipment 106 onboard the locomotive 102 of the consist 100, according to one embodiment of the present disclosure. In one embodiment, the user interface 176 of the apparatus 144 receives the user input to test the installation of the network equipment 106 onboard the locomotive 102. For the sake of brevity, some aspects of the present disclosure which are already explained in detail in the description of FIG. 1, FIG. 2, and FIG. 3 are not explained in the description of FIG. 4.

At step 402, the method 400 includes receiving signals from the locomotive 102 via the MU cable 132 by the test network equipment 166. In one embodiment, the signals received via the MU cable 132 may include, but are not limited to, the electric power generated by the generator, control signals generated by the control system 122 of the locomotive 102, and data packets associate with the communication system 134. The MU cable 132 may be connected to one of the first output port 124 and the second output port 126 of the locomotive 102 and the first port 168 of the test network equipment 166.

At step 404, the method 400 includes establishing the communication between the user interface 176 and the test network equipment 166 based on the predefined attribute of the user interface 176. At step 406, the method 400 includes receiving the status message from the test network equipment 166 by the user interface 176. The status message indicates the identification of the network equipment 106 onboard the locomotive 102 by the test network equipment 166. The test network equipment 166 identifies the network equipment 106 onboard the locomotive 102 based on the signals received from the locomotive 102 via the MU cable 132. The method 400 may further include displaying the identification tag of the locomotive 102 having the network equipment 106 based on the status message received from the test network equipment 166. The test network equipment 166 establishes the communication with the test network equipment 166 and the network equipment 106 onboard the locomotive 102 when the test network equipment 166 is identified by the test network equipment 166.

At step 408, the method 400 includes establishing the one or more communication routes between the network equipment 106 onboard the locomotive 102 and the user interface 176. The one or more communication routes are established when the network equipment 106 onboard the locomotive 102 is identified by the test network equipment 166. The method 400 may further include displaying the status of the one or more communication routes established between the identified network equipment 106 onboard the locomotive 102 and the user interface 176.

At step 410, the method 400 includes sending the request to the network equipment 106 onboard the locomotive 102 via the established one or more communication routes. At step 412, the method 400 includes determining the status of the installation of the network equipment 106 onboard the locomotive 102. The status of the installation of the network equipment 106 onboard the locomotive 102 is determined based on the response corresponding to the request received from the network equipment 106 onboard the locomotive 102. The method 400 may further include displaying the status of the installation of the network equipment 106 onboard the locomotive 102.

The apparatus 144 may be implemented for the locomotives 102 without making any changes in the already existing construction of the locomotives 102. The present disclosure eliminates the use of test locomotive. This in turn would result into a significant reduction in the cost associated with installing of the network equipment 106 and simplifies the process of testing installation of the network equipment 106 in the locomotive 102. Therefore, the present disclosure offers the apparatus 144 and the method 400 for testing installation of the network equipment 106 onboard the locomotive 102 are simple, effective, economical, flexible, and time saving.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. An apparatus for testing installation of a network equipment onboard a locomotive of a consist, the apparatus comprising:
   a housing;
   a test network equipment disposed within the housing, and comprising a first port configured to connect with an output port of the locomotive via a Multiple Unit (MU) cable; and
   a user interface configured to connect with a second port of the test network equipment, wherein the test network equipment is configured to establish a communication with the user interface based on a predefined attribute of the user interface, and wherein, upon establishing the communication between the test network equipment and the user interface, the user interface configured to:
      receive a status message from the test network equipment, wherein the status message is indicative of identification of the network equipment onboard the locomotive by the test network equipment based on signals received from the locomotive via the MU cable;
      establish one or more communication routes with the network equipment onboard the locomotive and the user interface, when the network equipment onboard the locomotive is identified by the test network equipment;
      send a request to the network equipment onboard the locomotive via the established one or more communication routes; and
      determine a status of installation of the network equipment onboard the locomotive based on a response corresponding to the request received from the network equipment onboard the locomotive.

2. The apparatus of claim 1, wherein the first port is configured to connect with a plurality of pins of the MU cable.

3. The apparatus of claim 2 further comprising a connectivity test panel disposed in the housing, and electrically connected to the first port of the test network equipment, the connectivity test panel comprising a plurality of test points corresponding to the plurality of pins of the MU cable, and configured to detect an electrical connectivity of the output port of the locomotive with the first port of the test network equipment.

4. The apparatus of claim 1, wherein the user interface is further configured to:
   display a status of identification of the network equipment onboard the locomotive based on the status message received from the test network equipment;
   display an identification tag of the locomotive, when the network equipment onboard the locomotive is identified by the test network equipment;
   display a status of the one or more communication routes established between the identified network equipment onboard the locomotive and the user interface; and
   display the status of the installation of the network equipment onboard the locomotive.

5. The apparatus of claim 1, wherein the second port and the user interface are connected to each other via an ethernet cable.

6. The apparatus of claim 1 further comprising a power supply device electrically connected to the MU cable and configured to supply power to the test network equipment.

7. The apparatus of claim 1, wherein the housing defines a storage area to accommodate the MU cable and the ethernet cable.

8. The apparatus of claim 1, wherein the user interface is configured to receive a user input to test the installation of the network equipment onboard the locomotive.

9. The apparatus of claim 1 further comprising a first indicating unit disposed in the housing and configured to indicate at least one of a status of connection of a MU cable with the locomotive and the test network equipment, proximity of the network equipment onboard the locomotive and the test network equipment, and a damage of the MU cable.

10. The apparatus of claim 1 further comprising a second indicating unit disposed in the housing and configured to indicate at least one of a status of connection of the ethernet cable with the user interface and the test network equipment, a hardware failure of an ethernet interface in the network equipment, and a misconfiguration of the network equipment.

11. A method of testing installation of a network equipment onboard a locomotive of a consist, the method comprising:
receiving, by a test network equipment disposed within a housing of an apparatus for testing installation of the network equipment, signals from the locomotive via a multiple unit (MU) cable connected to a first port of the test network equipment and an output port of the locomotive;
establishing a communication between a user interface and the test network equipment based on a predefined attribute of the user interface, the user interface being configured to connect with a second port of the test network equipment;
receiving, by the user interface, a status message from the test network equipment, wherein the status message is indicative of identification of the network equipment onboard the locomotive by the test network equipment, based on the signals received from the locomotive via the MU cable;
establishing one or more communication routes between the network equipment onboard the locomotive and the user interface, when the network equipment onboard the locomotive is identified by the test network equipment;
sending a request to the network equipment onboard the locomotive via the established one or more communication routes; and
determining a status of the installation of the network equipment onboard the locomotive based on a response corresponding to the request received from the network equipment onboard the locomotive.

12. The method of claim 11 further comprising:
displaying a status of identification of the network equipment onboard the locomotive based on the status message received from the test network equipment;
displaying an identification tag of the locomotive, when the network equipment onboard the locomotive is identified by the test network equipment;
displaying a status of the one or more communication routes established between the identified network equipment onboard the locomotive and the user interface; and
displaying the status of the installation of the network equipment onboard the locomotive.

13. The method of claim 11 further comprising receiving an user input, by the user interface, to test the installation of the network equipment onboard the locomotive.

14. The method of claim 11 further comprising detecting an electrical connectivity of the output port of the locomotive and the first port of the test network equipment using a connectivity test panel, wherein the connectivity test panel is electrically connected to the first port of the test network equipment.

15. A testing system for a locomotive of a consist, the testing system comprising:
a network equipment onboard the locomotive; and
an apparatus connected to the network equipment onboard the locomotive, and configured to test installation of the network equipment onboard the locomotive, the apparatus comprising:
a housing;
a test network equipment disposed within the housing, and comprising a first port configured to connect with an output port of the locomotive via a Multiple Unit (MU) cable; and
a user interface configured to connect with a second port of the test network equipment, wherein the test network equipment is configured to establish a communication with the user interface based on a predefined attribute of the user interface, and wherein, upon establishing the communication between the test network equipment and the user interface, the user interface is configured to:
receive a status message from the test network equipment, wherein the status message is indicative of identification of the network equipment onboard the locomotive by the test network equipment based on signals received from the locomotive via the MU cable;
establish one or more communication routes with the locomotive and the user interface, when the network equipment onboard the locomotive is identified by the test network equipment;
send a request to the network equipment onboard the locomotive via the established one or more communication routes; and
determine a status of installation of the network equipment onboard the locomotive based on a response corresponding to the request received from the network equipment onboard the locomotive.

16. The testing system of claim 15, wherein the apparatus comprises a connectivity test panel disposed in the housing and electrically connected to the first port of the test network equipment, the connectivity test panel comprising a plurality of test ports corresponding to a plurality of pins of the MU cable, and configured to detect an electrical connectivity of the output port of the locomotive with the first port of the test network equipment.

17. The testing system of claim 15, wherein the user interface is configured to:
display a status of identification of the network equipment onboard the locomotive based on the status message received from the test network equipment;
display an identification tag of the locomotive, when the network equipment onboard the locomotive is identified by the test network equipment;
display a status of the one or more communication routes established between the identified network equipment onboard the locomotive and the user interface; and
display the status of the installation of the network equipment onboard the locomotive.

18. The testing system of claim 15, wherein the apparatus further comprises a first indicating unit disposed in the housing and configured to indicate at least one of a status of connection of a MU cable with the locomotive and the test network equipment, proximity of the network equipment onboard the locomotive and the test network equipment, and a damage of the MU cable.

19. The apparatus of claim 15, wherein the apparatus further comprises a second indicating unit disposed in the housing and configured to indicate at least one of a status of connection of an ethernet cable with the user interface and the test network equipment, a hardware failure of an ethernet interface in the network equipment, and a misconfiguration of the network equipment.

20. The testing system of claim 15, wherein the housing defines a storage area to accommodate the MU cable and the ethernet cable.

* * * * *